United States Patent
Deiters et al.

(10) Patent No.: US 8,026,788 B2
(45) Date of Patent: Sep. 27, 2011

(54) THIN-FILM RESISTOR WITH A LAYER STRUCTURE AND METHOD FOR MANUFACTURING A THIN-FILM RESISTOR WITH A LAYER STRUCTURE

(75) Inventors: Heinz Deiters, Duelmen (DE); Susanne Linnenberg, Schermbeck (DE); Dirk Nachrodt, Dulsburg (DE); Uwe Paschen, Dortmund (DE); Holger Vogt, Muelheim (DE)

(73) Assignees: Fraunhofer—Gesellschaft zur Foerderung der angewandten Forschung e.V., Munich (DE); Universitaet Duisburg—Essen Forsthausweg, Duisburg (DE)

( * ) Notice: Subject to any disclaimer, the term of this patent is extended or adjusted under 35 U.S.C. 154(b) by 544 days.

(21) Appl. No.: 12/095,756

(22) PCT Filed: Dec. 9, 2005

(86) PCT No.: PCT/EP2005/013229
§ 371 (c)(1),
(2), (4) Date: Oct. 30, 2008

(87) PCT Pub. No.: WO2007/065460
PCT Pub. Date: Jun. 14, 2007

(65) Prior Publication Data
US 2009/0206982 A1    Aug. 20, 2009

(51) Int. Cl.
*H01C 1/012*    (2006.01)

(52) U.S. Cl. ......... 338/308; 338/309; 438/627; 257/750
(58) Field of Classification Search .................. 338/308, 338/309; 438/627, 384, 653, 240; 257/750
See application file for complete search history.

(56) References Cited

U.S. PATENT DOCUMENTS

| | | | | |
|---|---|---|---|---|
| 5,723,382 A * | 3/1998 | Sandhu et al. | ............... | 438/653 |
| 6,017,789 A * | 1/2000 | Sandhu et al. | ............... | 438/240 |
| 6,028,359 A * | 2/2000 | Merchant et al. | ............ | 257/750 |
| 6,313,027 B1 * | 11/2001 | Xu et al. | .................... | 438/627 |
| 6,607,962 B2 * | 8/2003 | Zekeriya et al. | ............. | 438/384 |
| 2001/0019301 A1 | 9/2001 | Shibuya et al. | | |
| 2005/0122207 A1 | 6/2005 | Vialpando et al. | | |

OTHER PUBLICATIONS

Official communication issued in counterpart International Application No. PCT/EP2005/013229, mailed on Oct. 8, 2006.
Wang et al.: "The Effect of Thermal Treatment on the Electrical Properties of Titanium Nitride Thiin Films by Filtered ARC Plasma Method," Ceramics International; vol. 30; No. 7; pp. 1921-1924; May 2004.

* cited by examiner

*Primary Examiner* — Kyung Lee
(74) *Attorney, Agent, or Firm* — Keating & Bennett, LLP

(57) ABSTRACT

A thin-film resistor with a layer structure with a Ti layer and a TiN layer is described, wherein a layer thickness of the Ti layer and a layer thickness of the TiN layer are selected such that a resulting temperature coefficient of resistance (TCR) is smaller than 1000 ppm/° C.

6 Claims, 3 Drawing Sheets

THIN-FILM RESISTOR WITH A LAYER STRUCTURE AND METHOD FOR MANUFACTURING A THIN-FILM RESISTOR WITH A LAYER STRUCTURE

TECHNICAL FIELD

The present invention relates to thin-film resistors, e.g. for employment in integrated circuits, but also as a discrete device.

BACKGROUND

In many discrete or integrated circuits, precise and, above all, temperature-independent or almost temperature-independent resistors are a substantial element to guarantee the needed accuracy of the circuit over the entire permitted temperature range.

The electrical resistance of most materials has a relatively high temperature dependence. In metals, the resistance generally increases with increasing temperature, with semiconductors, it decreases. The temperature coefficient of resistance, which in English is also called temperature coefficient of resistance (TCR) and which is on the order of 4,000 ppm/° C. (ppm=part per million) for typical metals such as aluminum, is a measure for the temperature dependence. Only some special materials have a very small temperature dependence of resistance, with those, the TCR is close to 0 ppm/° C., depending on the manufacturing method. Examples for such materials are various alloys such as NiCr, NiCrAl, SiCr or compounds such as TaN.

In CMOS processes (CMOS=complementary metal oxide semiconductor), the wiring of the devices is made, as a rule, through several metal planes connected among each other by contacts. FIG. 4 shows a schematic design of the wiring planes of a standard CMOS device, or process, by example of a three-sheet metallization. The CMOS device comprises four sheets, a first sheet 410 with polysilicon conductive traces 412, a second sheet 420 with the first metal plane, or the first plane of metal conductive traces 422, a third sheet 430 with the second metal plane 432, or the second plane of metal conductive traces, and a fourth sheet 440 with a third metal plane 442, or a third plane of metal conductive traces, the conductors, i.e. the polysilicon conductive traces 412 as well as the conductive traces of the first metal plane 422, the second metal plane 432 and the third metal plane 442 being isolated by an isolator 450 of silicon oxide, and wherein the polysilicon conductive traces 412 are further connected to the conductive traces of the first metal plane 422 by a contact 414 and the conductive traces of the first metal plane 422, the second metal plane 432 and the third metal plane 442 are connected to the respective next metal plane by contacts 424 and 434.

For many applications, particularly in the field of integrated circuits fabricated in the so-called CMOS technology, temperature-independent resistors are needed as reference elements. However, all the resistor layers used as a standard in the CMOS process have TCR values significantly too high, so that they cannot be used for highly precise applications. Thus, in some cases, specially extended CMOS processes are employed, in which thin-film resistors are integrated with the above-mentioned materials. In association with CMOS processes, however, these materials have serious disadvantages. On the one hand, apparatuses for depositing and patterning these materials are not present in the common fabrication lines, only TaN is here an exception in processes with very small structure sizes. Therefore, their employment is associated with significant additional costs. On the other hand, most of the materials have a potentially negative influence on the CMOS devices. If contaminations which can be caused by these special materials come into the range of the devices, they can lead to significant parameter changes or even to a failure of the circuits.

SUMMARY

According to an embodiment, a thin-film resistor with a layer structure may have: a Ti layer; and a TiN layer; wherein a layer thickness of the Ti layer and a layer thickness of the TiN layer are selected such that a resulting temperature coefficient of resistance (TCR) is smaller than 1000 ppm/° C.

According to another embodiment, a method for manufacturing a thin-film resistor with a layer structure with a Ti layer and a TiN layer may have the steps of: generating the Ti layer and the TiN layer; wherein a layer thickness of the Ti layer and a layer thickness of the TiN layer are selected such that a resulting temperature coefficient of resistance (TCR) is smaller than 1000 ppm/° C.

The present invention is based on the knowledge that the temperature coefficient of resistance TCR of Ti/Tin layer systems, which is usually at several 1000 ppm/° C., may be significantly reduced by a suitable further reduction of the layer thickness, and may be further optimized by a subsequent thermal treatment, annealing, if necessitated.

If such layers are manufactured with suitable thicknesses, quite small TCR values on the order of a few 100 ppm/° C. may already be realized with the same. By a suitable thermal post-treatment, these TCR values may be reduced even further and brought almost to zero, so that highly precise resistors may thus be realized.

Specifically, quite small TCR values in the range of approximately 200 ppm/° C. may be achieved by the reduced layer thicknesses alone, which are lower than 15 nm, advantageously, however, in the ranges of approximately 2-10 nm for Ti, and for TiN are lower than 50 nm, advantageously, however, in a range of approximately 2-30 nm. An exemplary layer stack is Ti 5 nm/TiN 15 nm.

The layer stack Ti/TiN is generated, for example, by successive sputtering of the materials, however, the layers may also be deposited by vapor deposition.

By an additional annealing step of approximately 700° C. for approximately 30 s, advantageously in an RTA assembly (RTA=rapid thermal annealing) under nitrogen atmosphere, even smaller or even negative TCR values may be achieved, depending on the details of the annealing operation, which allows employment of the layers in highly precise circuits. Methods comprise a annealing step at temperatures in a range of 650° C. to 750° C. with a duration in a range of 40 s to 20 s. Instead of the just mentioned variant of a annealing step in an RTA assembly at approximately 700° C., a annealing step may also be made at a lower temperature and, instead, with an extended time in an oven, e.g. a diffusion oven, at approximately 500° C. in a nitrogen atmosphere for approximately one hour, for example, to decrease the TCR value. For this embodiment, advantageous temperatures are in a range of 300° to 500° C., and the duration is in a range from 1.5 hours to 45 minutes. The inventive method may generally be applied at temperatures in a range of 300° to 800° and with durations in a range of 1.5 hours to 15 s, with the duration increasing with decreasing temperature. Instead of the nitrogen atmosphere, also other inert atmospheres, e.g. argon atmospheres, are possible.

The invention provides the possibility to integrate a thin-film resistor with a very small temperature dependence into CMOS processes for manufacturing integrated circuits, wherein with Ti/TiN, a material system is used which is utilized in most processes anyway or which may be integrated without any problems, if necessitated.

Layer systems of a combination of thin titanium and titanium nitride layers (Ti/TiN) are employed anyway in many CMOS processes as barrier layers preventing the unwanted reaction of different materials or as seed layers for growing subsequent layers.

As already explained, up to now, these layers had a temperature coefficient of resistance of several 1000 ppm/° C. when employed as a resistor, which is too high for precision applications. The present invention is new and advantageous in that by a suitable reduction of the layer thickness, the temperature coefficient of resistance TCR of these Ti/TiN layers may be significantly decreased, and may further be reduced by subsequent annealing, for example.

Apart from the integrated variant, this thin-film resistor may of course be also manufactured and employed as a discrete device, according to exactly the same principles.

The advantages over the conventional art are that with the material system Ti/TiN, substances for integrating thin-film resistors are used which are used in most processes anyway. On the one hand, this means that no additional investment in assemblies, e.g. for depositing, etching or cleaning, is needed and these assemblies and the processing have been tried and tested for decades. Additionally, it is thereby ensured that there is no danger of any negative effects on the CMOS process or contaminations arising as with the special materials described in the conventional art. Moreover, this material system offers an excellent long-term stability, also when employed under increased temperature.

BRIEF DESCRIPTION OF THE DRAWINGS

Embodiments of the present invention will be detailed subsequently referring to the appended drawings, in which.

DETAILED DESCRIPTION

In the embodiments illustrated in FIGS. 1a, 1b, 2 and 3, the method for manufacturing, or the resulting device, are each based on the previously described Ti/TiN layer order with suitable annealing, so as to realize the desired advantageous TCR values. The embodiments for the thin-film resistors of Ti/TiN layers set forth in the following show the diversity at different locations in which these Ti/TiN layers may be integrated in standard CMOS processes, or devices, however, they do not limit the invention to these embodiments.

Figure 1A:
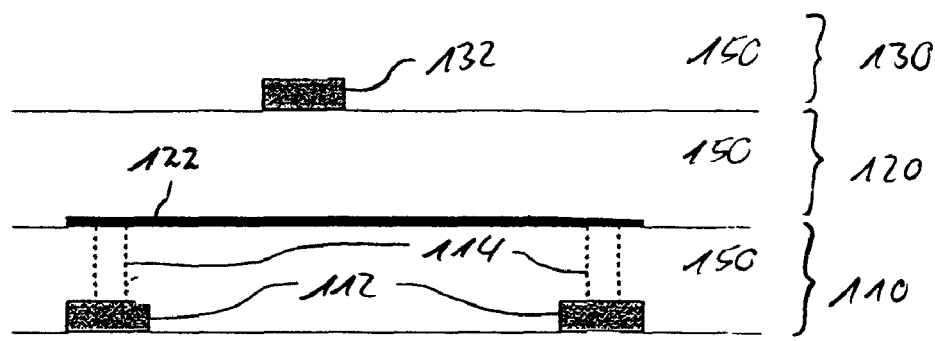
FIG. 1a is an exemplary inventive thin-film resistor layer as an additional intermediate plane, wherein contacting of the thin-film resistor layer is made by an underlying metal plane or polysilicon plane.

FIG 1a shows an embodiment of an inventive thin-film resistor, or an inventive thin-film resistor layer, 122 in an exemplary CMOS device with three sheets, a first sheet 110 with a normal or common metal or polysilicon plane 112, or conductive traces of normal metal or polysilicon, a second sheet 120 with the thin-film resistor 122, and a third sheet 130 with a normal metal plane 132, or conductive traces of normal metal. The sheets 110, 120, 130 further comprise an isolator 150, e.g. of silicon oxide. In this example, the resistor layer has been introduced, as the second sheet 120, as an additional intermediate plane, wherein contacting 114 of the thin-film resistor 122 is made by the underlying metal or polysilicon plane 112. Typical materials for the contacting 114 include tungsten, for example.

Figure 1B:
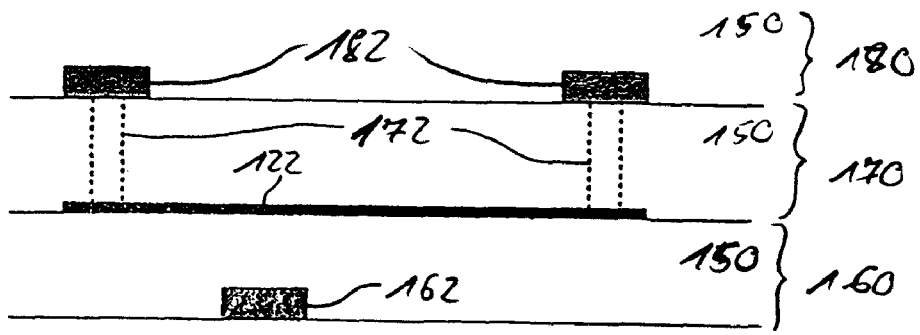
FIG. 1b is an exemplary inventive thin-film resistor layer as an additional intermediate layer, wherein contacting of the thin-film resistor layer is made by an overlying metal plane.

FIG. 1b shows a further embodiment of an inventive thin-film resistor 122, or an inventive thin-film resistor layer, wherein the thin-film resistor is inserted as an additional intermediate plane in an exemplary CMOS device with three sheets, with a first sheet 160 comprising a normal metal or polysilicon plane 162, a second sheet 170 comprising the thin-film resistor 122, and a third sheet 180 comprising a normal metal plane 182, or conductive traces of normal metal. The conductive traces of normal metal, or polysilicon, and the thin-film resistor are separated by an isolator 150.

Similar to FIG. 1a, the thin-film resistor 122 is inserted as an additional intermediate plane, however, the contacting 172 is made via the overlying metal plane 182.

During the manufacturing process, an isolating material, typically silicon oxide, is deposited before and after the resistor layer, for example. Connecting the resistor layer is made by the underlying metal trace 112, see FIG. 1a, or the overlying metal trace 182, see FIG. 1b, for example. If introduction of the intermediate plane is made before the first metal plane 132, then the contacting 114 may also be made via the polysilicon 112, see FIG. 1a, if necessitated.

The TCR of the resistor layer 122 may be additionally decreased by suitable annealing. If this is permitted by the metallization layers, which may already be present, or if the resistor layer is annealed before depositing the first metallization layer, this annealing may be made at approximately 700° C. in nitrogen. If this high temperature is not compatible with the process, see aluminum metallization, it may be replaced with longer annealing at a lower temperature, if necessitated, as has been previously already explained.

Figure 2:
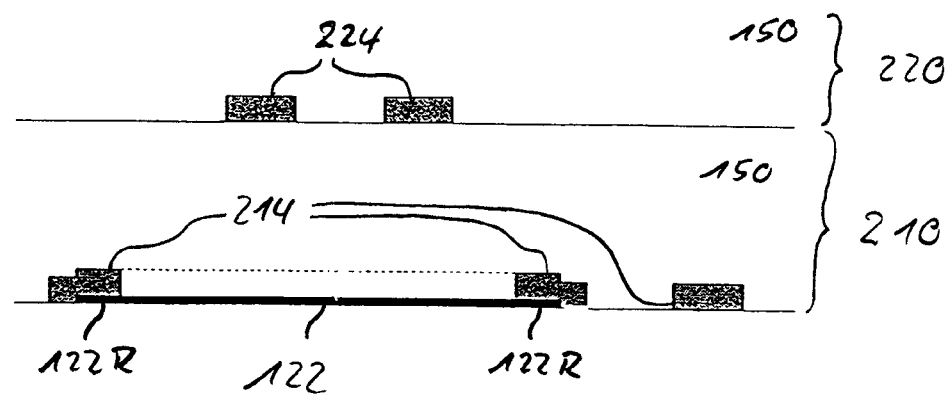
FIG. 2 is an exemplary inventive thin-film resistor layer directly integrated into a corresponding metal plane.

FIG. 2 shows an exemplary CMOS device with a further embodiment of an inventive thin-film resistor 122, wherein the thin-film resistor 122 is directly integrated into a corresponding metal plane. FIG. 2 shows two sheets, a first sheet 210 with the thin-film resistor 122 and a normal metal plane 214, and a second sheet 220 with further metal planes 224, if necessitated. The sheets 210 and 220 further comprise an isolator 150.

During the manufacturing process, the deposition of the resistor layer, its patterning and its annealing, if necessitated, are made directly before depositing one of the normal metallization layers 214, which comprise aluminum as a material, for example. Afterwards, the metallization layer 214 is deposited and patterned. The metallization layer 214 is afterwards selectively etched to the Ti/TiN resistor layer 122, so that the resistor is realized by a structure as depicted in FIG. 2. Here, the thin-film resistor 122 is contacted at the edge 122R by the metallization layer 214. In the dashed region, the metallization layer 214 is selectively removed, so that only the resistor layer 122 remains there.

By analogy to FIGS. 1a and 1b, the TCR of the resistor layer 122 may here also be optimized by suitable annealing.

Figure 3:
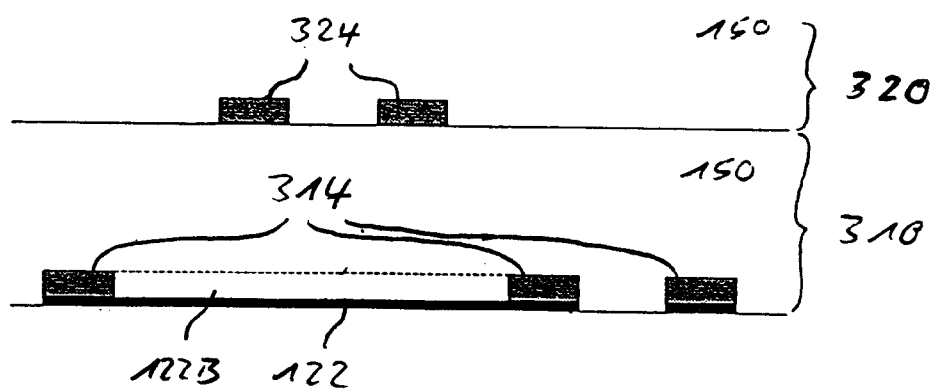
FIG. 3 is an exemplary inventive thin-film resistor layer directly integrated into a corresponding metal plane, wherein conductive traces of the metal plane are deposited on the thin-film resistor layer and the metal is locally removed from the resistor layer for forming the resistor.
Figure 4:
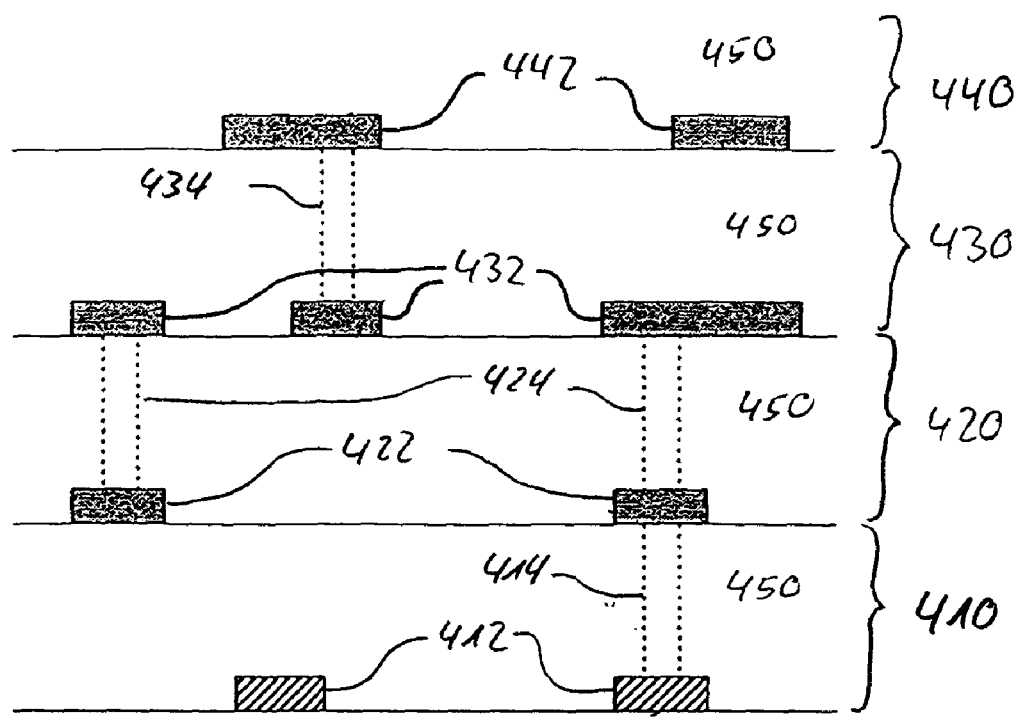
FIG. 4 is a possible schematic design of wiring planes of a standard CMOS device, or process.

FIG. 3 shows a further exemplary CMOS device with a further embodiment of an inventive thin-film resistor 122 directly integrated into the corresponding metal plane. FIG. 3 shows a first sheet 310 with the thin-film resistor 122 and a normal metal plane 314, and a second sheet 320 with further metal planes 324, if necessitated. The sheets 310 and 320 further comprise an isolator 150.

In this variant of the manufacturing process, after depositing and, if necessitated, annealing the resistor layer 122, deposition of the metallization layer 314 is made. This metallization layer 214 is then patterned together with the underlying resistor layer 122. Afterwards, the metallization layer 314 is selectively removed in the resistor region 122b. In this case, the resistor layer 122 in this metallization plane 310 remains under all metal traces 314, unlike the variant shown in FIG. 2.

If necessitated, a Ti/TiN barrier layer, which is already present in the process, may be used directly as a resistor layer if it has suitable layer thicknesses, which minimizes the additional expense needed for integrating the resistor 122.

In addition to the described examples for employing a resistor layer of Ti/TiN in CMOS processes, employment as a discrete precision resistor is also possible. Here, by analogy to the variants described above, the resistor layer is realized and contacted on an isolating substrate.

Alternatively, an inventive thin-film resistor may comprise more than one Ti or TiN layer.

Devices, in which one or a plurality of inventive thin-film resistors are employed, are not limited to the numbers of layers, or sheets, shown in FIGS. 1a, 1b, 2 or 3.

Further, devices comprising one or a plurality of inventive thin-film resistors are not limited to polysilicon or aluminum, for example, as conductive materials, but may comprise any conductive materials.

Furthermore, corresponding devices may comprise different isolators or isolator materials in the individual sheets, or materials other than silicon oxide.

Furthermore, the inventive thin-film resistor, or the method for manufacturing a thin-film resistor, are not limited to CMOS devices or processes only, but may also be applied in other technologies.

In summary, it may be thus be said that Ti and TiN, as volume crystals, comprise TCR values of several 1000 ppm/° C., which renders them unsuitable for highly precise applications. However, by the inventive transition to very small layer thicknesses, the material properties may be significantly modified, and, in particular, the temperature coefficient of resistance TCR may be significantly decreased. An additional possibility of modification results from a suitable temperature treatment, or annealing, of the layers, so that TCR values of almost zero, and, thus, temperature-independent resistors, or highly precise resistors, for integrated circuits with most demanding requirements may be provided for the inventive Ti/TiN thin-film resistors.

In particular, the advantage of a Ti/TiN thin-film resistor lies in the fact that this material system is already used in most processes, and, thus, no additional investments in assemblies are needed and no contaminations come into the devices' range.

Thus, microelectronical circuits, integrated sensors and discrete, highly precise thin-film resistors, or fabrication processes employed in their manufacture, are fields of application for the invention described.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A thin-film resistor, comprising:
   a first metal contact;
   a second metal contact; and
   a thin-film resistor layer structure arranged to extend between the first metal contact and the second metal contact, the thin-film resistor layer structure including:
      a Ti layer; and
      a TiN layer; wherein
   a layer thickness of the Ti layer and a layer thickness of the TiN layer are selected such that a resulting temperature coefficient of resistance (TCR) is smaller than 1000 ppm/° C.

2. The thin-film resistor according to claim 1, wherein a layer thickness of the Ti layer is smaller than 15 nm and a layer thickness of the TiN layer is smaller than 50 nm.

3. The thin-film resistor according to claim 1, with a layer thickness of the Ti layer in a range of 2-10 nm, and a layer thickness of the TiN layer in a range of 2-30 nm.

4. A method for manufacturing a thin-film resistor, comprising:
   forming a thin-film resistor layer structure including a Ti layer and a TiN layer; and
   forming a first metal contact and a second metal contact such that the thin-film resistor layer structure extends between the first metal contact and the second metal contact; wherein
   a layer thickness of the Ti layer and a layer thickness of the TiN layer are selected such that a resulting temperature coefficient of resistance (TCR) is smaller than 1000 ppm/° C.

5. The method according to claim 4, additionally comprising:
   thermal treatment of the thin-film resistor, wherein the thermal treatment is performed such that the resulting temperature coefficient of resistance (TCR) is smaller than 300 ppm/° C.

6. The method according to claim 5, wherein the thermal treatment is made in a range from 300° C. to 800° C. for a duration in a range from 1.5 hours to 15 s, and advantageously in a range from 650° C. to 750° C. for a duration in the range of 40 s to 20 s.

* * * * *